(12) United States Patent
Lu et al.

(10) Patent No.: US 9,938,460 B2
(45) Date of Patent: Apr. 10, 2018

(54) PHOSPHOR, LIGHT EMITTING APPARATUS AND METHOD OF FORMING PHOSPHOR

(71) Applicant: NATIONAL TAIWAN UNIVERSITY, Taipei (TW)

(72) Inventors: Chung-Hsin Lu, Taipei (TW); Che-Yuan Yang, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/438,726

(22) Filed: Feb. 21, 2017

(65) Prior Publication Data
US 2017/0158958 A1    Jun. 8, 2017

Related U.S. Application Data

(63) Continuation-in-part of application No. 13/854,151, filed on Apr. 1, 2013.

(30) Foreign Application Priority Data

Apr. 2, 2012    (TW) .............................. 101111664 A

(51) Int. Cl.
*C09K 11/77* (2006.01)
*C09K 11/08* (2006.01)
*H01L 33/50* (2010.01)

(52) U.S. Cl.
CPC ...... *C09K 11/7774* (2013.01); *C09K 11/0883* (2013.01); *C09K 11/7749* (2013.01); *H01L 33/502* (2013.01)

(58) Field of Classification Search
CPC ..................... C09K 11/7774; C09K 11/7749
See application file for complete search history.

(56) References Cited

U.S. PATENT DOCUMENTS

| 6,632,379 B2 | 10/2003 | Mitomo et al. |
| 6,649,946 B2 | 11/2003 | Bogner et al. |
| 7,193,358 B2 | 3/2007 | Yamada et al. |
| 7,525,127 B2 | 4/2009 | Hattori et al. |

(Continued)

FOREIGN PATENT DOCUMENTS

| CN | 102399552 A | 4/2012 |
| TW | I258499 B | 7/2006 |

(Continued)

OTHER PUBLICATIONS

Yang, Che-Yuan. Declaration under 37 CFR 1.132 in case U.S. Appl. No. 13/854,151, filed Apr. 20, 2016.*

*Primary Examiner* — Matthew E Hoban
(74) *Attorney, Agent, or Firm* — CKC & Partners Co., Ltd.

(57) ABSTRACT

A phosphor having a formula of $T_xE_ySi_zN_rTb_aL_bM_c$ is provided, in which T is Mg, Ca, Sr or Ba; E is Mg, Ca, Ba, Ti, Cu, Zn, B, Al, In, Sn, Sb, Bi, Ga, Y, La or Lu; L is Li, Na or K; M is Ce, Pr, Nd, Pm, Sm, Gd, Dy, Ho, Er, Tm, Yb or Mn; and $1.4 \leq x \leq 2.6$, $0 \leq y \leq 0.5$, $4.3 \leq z \leq 5.6$, $7.4 \leq r \leq 9$, $0.01 \leq a \leq 0.5$, $0 \leq b \leq 0.5$, $0 \leq c \leq 0.5$, in which Tb ion is used as a luminescence center, and valence of the Tb ion is lower than 3+, and the phosphor is excited by an excitation light and has an emission band with a full width at half maximum greater than 50 nm. A method of forming the phosphor is also provided.

13 Claims, 2 Drawing Sheets

(56) References Cited

U.S. PATENT DOCUMENTS

| | | |
|---|---|---|
| 7,569,987 B2 | 8/2009 | Naitou |
| 2004/0135504 A1 | 7/2004 | Tamaki et al. |
| 2006/0175716 A1 | 8/2006 | Nakashima |
| 2008/0197321 A1* | 8/2008 | Hirosaki ............. C01B 21/0821 252/301.4 R |
| 2009/0284132 A1 | 11/2009 | Tamaki et al. |
| 2009/0284948 A1* | 11/2009 | Yamao .................. C04B 35/597 362/84 |
| 2009/0309485 A1 | 12/2009 | Tamaki et al. |
| 2010/0213820 A1* | 8/2010 | Sakai .................. C01B 21/0826 313/501 |
| 2011/0121234 A1* | 5/2011 | Hirosaki ............. C09K 11/0883 252/301.4 F |
| 2011/0304261 A1* | 12/2011 | Winkler ............. C09K 11/7734 313/503 |
| 2012/0119234 A1 | 5/2012 | Shioi et al. |

FOREIGN PATENT DOCUMENTS

| | | |
|---|---|---|
| TW | 200710203 A | 3/2007 |
| TW | I306675 B | 2/2009 |
| TW | I340480 B | 4/2011 |
| TW | I353377 B | 12/2011 |
| WO | 2010029184 A1 | 3/2010 |

* cited by examiner

PHOSPHOR, LIGHT EMITTING APPARATUS AND METHOD OF FORMING PHOSPHOR

RELATED APPLICATIONS

This application is a continuation-in-part of U.S. application Ser. No. 13/854,151 filed Apr. 1, 2013, which claims priority to Taiwan Application Serial Number 101111664, filed Apr. 2, 2012, all of which are herein incorporated by reference.

BACKGROUND

Field of Invention

The present invention relates to a phosphor, a light emitting apparatus including the phosphor, and a method of forming the phosphor.

Description of Related Art

The light emitting diode (LED) is a mercury-free environmental friendly light source with advantages, such as low power consumption, high service life, fast response speed, no heat radiation and small volume. In 1996, the technology, which uses a blue LED with yttrium aluminum garnet (YAG) yellow phosphor together to generate a white light, was firstly issued by Nichia Corporation of Japan, and thereafter the white light emitting diode (WLED) has been formally commercialized. Due to the flourish development of the related technical industries in recent years, the luminous efficiency and the reliability of the WLED product have been increased continuously. Therefore, with the development trend of energy conservation and carbon reduction, the WLED, referred to as a green energy light source, is expected to gradually replace the conventional lighting apparatus such as an incandescent bulb, and will be used widely in industries, for example, general apparatus, displayer, automobile, electronics and communications.

The white light emitted by the WLED is a two-wavelength light, three-wavelength light or four-wavelength light as a result of a mixture of multiple colors. At present, the manufacturing method of WLED includes: exciting a yellow phosphor with a blue LED; exciting a red phosphor and a green phosphor with a blue LED; exciting phosphors of multiple colors with a purple LED or a UV LED (e.g., the disclosure of Patent I340480 of Taiwan); using two to four kinds of LEDs to mix emitted light thereof to form a white light by adjusting individual brightness of the LEDs; and so on. The WLED which is manufactured by using the blue LED to excite the YAG phosphor to generate a yellow light and then mixing the yellow light and the blue light to generate a white light still has become a mainstream on the market due to its low cost and high efficiency. However, the color rendering of the WLED is incomparable with the conventional bulb and the power saving bulb. Therefore, a red phosphor should be added in order to realize a warm white light LED. When the blue LED is used together with the red phosphor and the green phosphor, both the color temperature and the color rendering are improved and the efficiency is also good.

The phosphor is a common luminescent material, wherein an inorganic phosphor generates a fluorescent light through electron transition. When the phosphor is excited by the light, the electrons in the phosphor are excited to the excited state of the high energy level and then the electrons return to the original low energy level state. At this time, the energy is radiated in the form of light. The inorganic phosphor is mainly constituted by a host lattice and an activator. Sometimes, if necessary, a co-activator or a sensitizer may be added to facilitate the luminous efficiency. The activator is used as a luminescence center while the host lattice delivers energy during the process of excitation. If a combination of the host lattice and the activator is changed the wavelength of the light emitted by the phosphor can be changed so as to generate different luminescence colors. In addition, chemical composition of the host lattice, the type and concentration of the activator and other factors all can affect the luminous efficiency of the phosphor. The development of the fluorescent material is from the early-stage unstable sulfide to the later silicon oxide (silicate) fluorescent material which has a good chemical stability. In recent years the nitride/oxynitride fluorescent material is very popular.

At present, the typically phosphor includes an aluminum oxide phosphor, a silicon oxide phosphor and a nitride/oxynitride phosphor and so on. The Ce-doped YAG phosphor (mainly constituted by $Y_3Al_5O_{12}$:Ce) provided by Nichia Corporation of Japan in 1996, the TAG phosphor (mainly constituted by $Tb_3Al_5O_{12}$:Ce) provided by OSRAM GmbH of Germany in 1999 and the phosphor disclosed by Patent I353377 of Taiwan all are aluminum oxide phosphors using Ce as the activator. Moreover, $Ba_2MgSi_2O_7$:Eu phosphor provided by GE Company of U.S. in 1998 and the phosphor disclosed by Patent I306675 of Taiwan using Ce, Eu, Mn and so on as the activator and so on are silicon oxide phosphors. In addition, since the nitride and the oxynitride have excellent performances, such as good thermal stability, good chemical stability, nontoxicity and high strength, the phosphors which use the nitride and the oxynitride as the host lattices are also published gradually, such as the disclosures of U.S. Pat. No. 6,649,946, U.S. Pat. No. 6,632,379, U.S. Pat. No. 7,193,358, U.S. Pat. No. 7,525,127 and U.S. Pat. No. 7,569,987 and U.S. Patent Publications US 2009/0309485 and US 2006/0175716. However, in the general nitride/oxynitride phosphor, if Tb (Terbium) ion is used as the activator, its applicable value is always affected by the problems, such as the poor luminous efficiency and the absence of adjustability for the light color caused by a narrow emission band. Therefore, it is still needed to research and develop a phosphor which can overcome the disadvantages of the conventional technology and has a high applicable value.

SUMMARY

According to some embodiments of the present disclosure, a phosphor having a formula of $T_xE_ySi_zN_rTb_aL_bM_c$ is provided, in which T is Mg, Ca, Sr or Ba; E is Mg, Ca, Ba, Ti, Cu, Zn, B, Al, In, Sn, Sb, Bi, Ga, Y, La or Lu; L is Li, Na or K; M is Ce, Pr, Nd, Pm, Sm, Gd, Dy, Ho, Er, Tm, Yb or Mn; and $1.4 \leq x \leq 2.6$, $0 \leq y \leq 0.5$, $4.3 \leq z \leq 5.6$, $7.4 \leq r \leq 9$, $0.01 \leq a \leq 0.5$, $0 \leq b \leq 0.5$, $0 \leq c \leq 0.5$, in which Tb ion is used as a luminescence center, and valence of the Tb ion is lower than 3+, and the phosphor is excited by an excitation light and has an emission band with a full width at half maximum greater than 50 nm.

According to some embodiments of the present disclosure, a light emitting apparatus is provided, which includes the phosphor above.

According to some embodiments of the present disclosure, a method of forming a phosphor is provided, which includes mixing a Tb-containing compound, a Si-containing compound and a IIA metal-containing compound to form a mixture, and each of the Tb-containing compound, the Si-containing compound and the IIA metal-containing compound is nitride or oxide, and at least one of the Tb-containing compound, the Si-containing compound and the IIA metal-containing compound is nitride; and calcining the mixture in an atmosphere to form the phosphor comprising Tb ion, Si ion, IIA-metal ion and N ion, in which the atmosphere comprises a carbon-containing compound and a gas selected from the group consisting of hydrogen, ammonia and a combination thereof, and the Tb ion of the phosphor has a valence lower than 3+.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
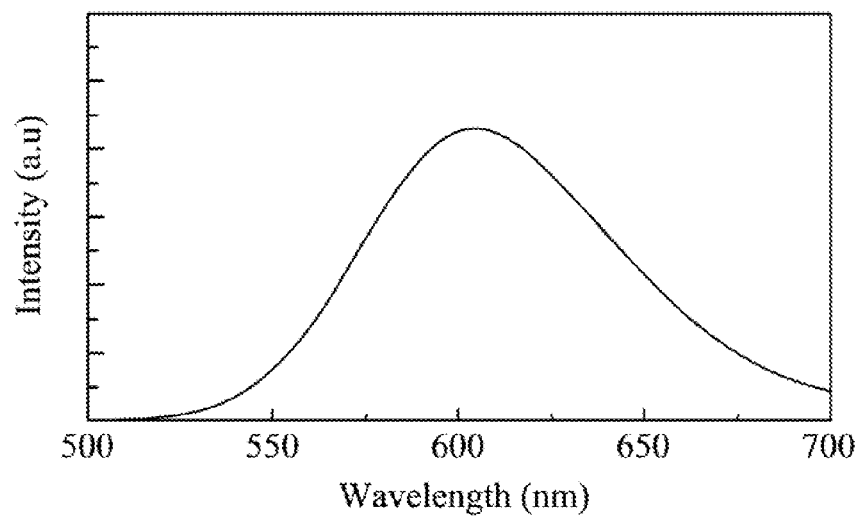
FIG. 1 is a luminescent spectrum of $Sr_{2.3}Si_5Tb_{0.08}N_{8.28}$ phosphor according to Embodiment 1 of the present invention.

The implementation of the present invention is described by the particular specific embodiments as follows and those of skills in the art can know other advantages and functions of the present invention from the content disclosed by the specification. The present invention also can be implemented or applied by other different specific embodiments. Various modifications and changes can be made to details of the specification based on different views and applications, without departing from the spirit of the present invention.

Unless otherwise stated herein, the singular forms "a" and "the" used in the specification and the accompanying claims include a plurality of individuals.

Unless otherwise stated herein, the term "or" used in the specification and the accompanying claims generally includes the meaning of "and/or".

In view of the disadvantages of the prior art, the present invention provides a phosphor suitable for a light emitting apparatus, and more particularly suitable for a LED light source, which meets the needs of the industrial application.

The present invention provides a phosphor which includes alkali earth ions, Si ion N ion and Tb ion. Tb ion is used as a luminescence center. The phosphor is excited by an excitation light which can be absorbed by Tb ion and has an emission band with a full width at half maximum (FWHM) greater than 50 nanometers (nm), preferably greater than 55 nm and more preferably greater than or equal to 60 nm or 80 nm.

According to a specific embodiment of the present invention, the alkali earth ions are Mg ion, Ca ion, Sr ion, Ba ion or a combination thereof.

According to a specific embodiment of the present invention, the phosphor is excited by an excitation light having a wavelength of 250-600 nm and has an emission band with a FWHM greater than 50 nm.

According to another specific embodiment of the present invention, the phosphor is excited by an excitation light having a wavelength of 350-600 nm and has an emission band with a FWHM greater than 50 nm.

According to a specific embodiment of the present invention, the phosphor is as shown in Formula (I):

$$T_xE_ySi_zN_rTb_aL_bM_c \qquad (I),$$

wherein,
T is Mg, Ca, Sr or Ba;
E is Mg, Ca, Ba, Ti, Cu, Zn, B, Al, In, Sn, Sb, Bi, Ga, Y, a or Lu;
L is Li, Na or K;
M is Ce, Pr, Nd, Pm, Sm, Eu, Gd, Dy, Ho, Er, Tm, Yb or Mn; and
$1.4 \leq x \leq 2.6$, $0 \leq y \leq 0.5$, $4.3 \leq z \leq 5.6$, $7.4 \leq r \leq 9$, $0.01 \leq a \leq 0.5$, $0 \leq b \leq 0.5$ and $0 \leq c \leq 0.5$.

According to a specific embodiment of the present invention, the phosphor shown in Formula (I) is excited by an excitation light which can be absorbed by Tb ion and has an emission band with a FWHM greater than 50 nm.

According to another specific embodiment of the present invention, the phosphor shown in Formula (I) is excited by an excitation light having a wavelength of 250-600 nm and has an emission band with a FWHM greater than 50 nm.

According to a further specific embodiment of the present invention, the phosphor shown in Formula (I) is excited by an excitation light having a wavelength of 350-600 nm and has an emission band with a FWHM greater than 50 nm.

According to a specific embodiment of the present invention, the phosphor is excited by an excitation light which can be absorbed by Tb ion and has an excitation band with a FWHM greater than 60 nm. In a specific embodiment, an integral area of an excitation band strength in a wavelength of 350-600 nm of the phosphor of the present invention is 0.1 times greater than an integral area of an excitation band strength in a wavelength of 200-350 nm.

According to a specific embodiment of the present invention, the phosphor has an average particle size from 0.01 micrometers (μm) to 50 μm.

The phosphor of the present invention is suitable for a light emitting apparatus, and more particularly suitable for a LED. According to a specific embodiment of the present invention, the light emitting apparatus also includes a light source.

The phosphor of the present invention is excited by an excitation light and has a broad emission band. Therefore, it can overcome the disadvantages of the poor efficiency and the absence of adjustability for the light color in the conventional phosphors, and meets the industrial needs greatly.

In the phosphor shown in Formula (I), Tb ion is used as a luminescence center. The phosphor is excited by an excitation light which can be absorbed by Tb ion and has an emission band with a FWHM greater than 50 nm, preferably greater than 55 nm and more preferably greater than or equal to 60 nm or 80 nm.

The phosphor of the present invention can be excited by an excitation light having a wavelength of 120-700 nm, preferably 200-700 nm, more preferably 250-650 nm and further more preferably 350-600 nm.

The phosphor of the present invention can be excited by an excitation light which can be absorbed by Tb ion and has an emission band with a FWHM greater than 50 nm, preferably greater than 55 nm and more preferably greater than or equal to 60 nm or 80 nm.

According to a specific embodiment of the present invention, the phosphor of the present invention is excited by an excitation light having a wavelength of 120-700 nm and has an excitation band with a FWHM of 20-150 nm. According to another specific embodiment of the present invention, the phosphor of the present invention is excited by an excitation light having a wavelength of 120-700 nm and has an emission band with a FWHM greater than 50 nm, preferably greater than 55 nm and more preferably greater than or equal to 60 nm or 80 nm. In some aspects of these embodiments, the phosphor of the present invention is excited by an excitation light having a wavelength of 250-650 nm and has an emission band with a FWHM greater than 50 nm, preferably greater than 55 nm and more preferably greater than or equal to 60 nm or 80 nm. In some aspects of these embodiments, the phosphor of the present invention is excited by an excitation light having a wavelength of 350-600 nm and has an emission band with a FWHM greater than 50 nm, preferably greater than 55 nm and more preferably greater than or equal to 60 nm or 80 nm.

In a general phosphor, if Terbium (Tb) ion is used as the activator, its applicable value is always affected by the problems, such as the poor efficiency and the absence of adjustability for the light color caused by the narrow emission band.

The phosphor of the present invention is excited by an excitation light which can be absorbed by Tb ion and has a broad emission band in a luminescent spectrum. Therefore, the phosphor of the present invention can overcome the disadvantages of the poor efficiency and the absence of the adjustability for the light color in the conventional phosphors. According to a specific embodiment of the present invention, the phosphor of the present invention is excited by an excitation light which can be absorbed by Tb ion and it has an emission band with a FWHM greater than 50 nm in the luminescent spectrum, preferably greater than 55 nm and more preferably greater than or equal to 60 nm or 80 nm. According to a specific embodiment of the present invention, the phosphor of the present invention is excited by an excitation light which can be absorbed by Tb ion and it has an emission band with a FWHM greater than 50 nm in the luminescent spectrum from a yellow light area to a red light area, preferably greater than 55 nm and more preferably greater than or equal to 60 nm or 80 nm.

The phosphor of the present invention is excited by an excitation light which can be absorbed by Tb ion and has a broad excitation band. According to a specific embodiment of the present invention, the phosphor is excited by an excitation light which can be absorbed by Tb ion and has an excitation band with a FWHM greater than 50 nm, preferably greater than 70 nm and more preferably greater than 90 nm. According to a specific embodiment of the present invention, the phosphor of the present invention is excited by an excitation light having a wavelength of 120-700 nm and has an excitation band with a FWHM greater than 50 nm, preferably greater than 70 nm and more preferably greater than 90 nm. According to a specific embodiment of the present invention, the phosphor has a broad excitation band in a wavelength range of 350-600 nm. The broad excitation band has a FWHM greater than 50 nm, preferably greater than 70 nm and more preferably greater than 90 nm.

According to a specific embodiment of the present invention, an integral area of an excitation band strength in a wavelength of 350-600 nm of the phosphor is greater than that of an excitation band strength in a wavelength of 200-350 nm. According to a specific embodiment of the present invention, an integral area of an excitation band strength having a wavelength of 350-600 nm of the phosphor is 0.1 times greater than an integral area of an excitation band strength having a wavelength of 200-350 nm. Preferably, an integral area of an excitation band strength having a wavelength of 350-600 nm of the phosphor is 0.2 times greater than, and preferably 0.3 times greater than an integral area of an excitation band strength having a wavelength of 200-350 nm.

An average particle size of the phosphor of the present invention is 0.01 μm to 50 μm, preferably 0.05 μm to 30 μm and more preferably 0.1 μm to 10 μm.

According to a specific embodiment of the present invention, the phosphor shown in Formula (I) is the phosphor shown in Formula (I-1) as follows:

$T_xSi_zN_rTb_a$     (I-1), wherein, T, x, z, r and a are defined as above.

In the phosphor shown in Formula (I-1), T is preferably Ca, Sr or Ba. The phosphor shown in Formula (I-1) is preferably constituted by Sr, Si, N and Tb. The example of the phosphor shown in Formula (I-1) includes, but not limited to, $Sr_{1.4}Si_{5.6}Tb_{0.3}N_{8.7}$, $Sr_2Si_5Tb_{0.15}N_{8.15}$, $Sr_{2.6}Si_{4.3}Tb_{0.001}N_{7.48}$ and $Sr_{1.88}Si_5Tb_{0.08}N_8$. According to a specific embodiment of the present invention, the phosphor shown in Formula (I-1) is excited by an excitation light which can be absorbed by Tb ion and has an emission band with a FWHM greater than 50 nm, preferably greeter than 55 nm and more preferably greater than or equal to 60 nm or 80 nm. In some aspects of these embodiments, the phosphor shown in Formula) is excited by an excitation light having a wavelength of 250-600 nm and has an emission band with a FWHM greater than 50 nm, preferably greater than 55 nm and more preferably greater than or equal to 60 nm or 80 nm. In some aspects of these embodiments, the phosphor shown in Formula (I-1) is excited by an excitation light having a wavelength of 350-600 nm and has an emission band with a FWHM greater than 50 nm, preferably greater than 55 nm and more preferably greater than or equal to 60 nm or 80 nm. According to a specific embodiment of the present invention, the phosphor shown in. Formula (I-1) is excited by an excitation light which can be absorbed by Tb ion and has an emission band from a yellow light area to a red light area in a luminescent spectrum. According to a specific embodiment of the present invention, the phosphor shown in Formula (I-1) is excited by an excitation light which can be absorbed by Tb ion and has an emission band with a FWHM greater than 50 nm in the luminescent spectrum from a yellow light area to a red light area, preferably greater than 55 nm and more preferably greater than or equal to 60 nm or 80 nm. According to a specific embodiment of the present invention, the phosphor shown in Formula (I-1) has a broad excitation band in a wavelength range of 350-600 nm. The broad excitation band has a FWHM greater than 50 nm, preferably greater than 70 nm and more preferably greater than 90 nm.

According to a specific embodiment of the present invention, the phosphor shown in Formula (I) is the phosphor shown in Formula (I-2) as follows:

$T_xSi_zN_rTb_aL_b$     (I-2), wherein, T, L, x, z, r, a and b are defined as above.

In the phosphor shown in Formula (I-2), T is preferably Ca, Sr or Ba. The phosphor shown in Formula (I-2) is preferably constituted by Ca, Sr or Ba, Si, N, Tb and Li, Na or K. The example of the phosphor shown in Formula (I-2) includes, but not limited to, $Sr_{1.94}Si_5Tb_{0.03}Li_{0.03}N_8$, $Sr_{1.9}Si_5Tb_{0.03}Li_{0.03}N_{7.97}$, $Ca_{1.92}Si_5Tb_{0.04}Li_{0.04}N_8$, $Ba_{1.92}Si_5Tb_{0.04}Li_{0.04}N_8$, $Sr_{1.9}Si_{5.1}Tb_{0.1}K_{0.15}N_{8.22}$ and $Sr_2Si_{5.2}Tb_{0.03}Na_{0.3}N_{8.4}$. According to a spec embodiment of the present invention, the phosphor shown in Formula (I-2) is excited by an excitation light which can be absorbed by Tb ion and has an emission band with a FWHM greater than 50 nm, preferably greater than 55 nm and more preferably greater than or equal to 60 nm or 80 nm. In some aspects of these embodiments, the phosphor shown in Formula (I-2) is excited by an excitation light having a wavelength of 250-600 nm and has an emission band with a FWHM greater than 50 nm, preferably greater than 55 nm and more preferably greater than or equal to 60 nm or 80 nm. In some aspects of these embodiments, the phosphor shown in Formula (I-2) is excited by an excitation light having a wavelength of 350-600 nm and has an emission band with a FWHM greater than 50 nm, preferably greater than 55 nm and more preferably greater than or equal to 60 nm or 80 nm. According to a specific embodiment of the present invention, the phosphor shown in Formula (I-2) is excited by an excitation light which can be absorbed by Tb ion and has an emission band from a yellow light area to a red light area in a luminescent spectrum. According to a specific embodiment of the present invention, the phosphor shown in Formula (I-2) is excited by an excitation light which can be absorbed by Tb ion and has an emission band with a FWHM greater than 50 nm in the luminescent spectrum from a yellow light area to a red light area, preferably greater than 55 nm and more preferably greater than or equal to 60 nm or 80 nm. According to a specific embodiment of the present invention, the phosphor shown in Formula (I-2) has a broad excitation band in a wavelength range of 350-600 nm. The broad excitation band has a FWHM greater than 50 nm, preferably greater than 70 nm and more preferably greater than 90 nm.

According to a specific embodiment of the present invention, the phosphor shown in Formula (I) is the phosphor shown in Formula (I-3) as follows:

$$T_xSi_zN_rTb_aM_c \qquad (I\text{-}3),$$

wherein, T, M, x, z, r, a and c are as defined as above.

In the phosphor shown in Formula (I-3) T is preferably Ca, Sr or Ba. In the phosphor shown in Formula (I-3), M is preferably Eu, Dy or Mn. The phosphor shown in Formula (I-3) is preferably constituted by Sr, Si, N, Tb and Eu, Dy or Mn. The example of the phosphor shown in Formula (I-3) includes, but not limited to, $Sr_{2.5}Si_{4.8}Tb_{0.2}Mn_{0.2}N_{8.4}$, $Sr_{2.4}Si_{4.7}Tb_{0.3}Dy_{0.3}N_{8.47}$ and $Sr_2Si_5Tb_{0.03}Eu_{0.03}N_{8.05}$. According to a specific embodiment of the present invention, the phosphor shown in Formula (I-3) is excited by an excitation light which can be absorbed by Tb ion and has an emission band with a FWHM greater than 50 nm, preferably greater than 55 nm and more preferably greater than or equal to 60 nm or 80 nm. In some aspects of these embodiments, the phosphor shown in Formula (I-3) is excited by an excitation light having a wavelength of 250-600 nm and has an emission band with a FWHM greater than 50 nm, preferably greater than 55 nm and more preferably greater than or equal to 60 nm or 80 nm. In some aspects of these embodiments the phosphor shown in Formula (I-3) is excited by an excitation light having a wavelength of 350-600 nm and has an emission band with a FWHM greater than 50 nm, preferably greater than 55 nm and more preferably greater than or equal to 60 nm or 80 nm. According to a specific embodiment of the present invention, the phosphor shown in Formula (I-3) is excited by an excitation light which can be absorbed by Tb ion and has an emission band from a yellow light area to a red light area in a luminescent spectrum. According to specific embodiment of the present invention, the phosphor shown in Formula (I-3) is excited by an excitation light which can be absorbed by Tb ion and has an emission band with a FWHM greater than 50 nm in the luminescent spectrum from a yellow light area to a red light area, preferably greater than 55 nm and more preferably greater than or equal to 60 nm or 80 nm. According to a specific embodiment of the present invention, the phosphor shown in Formula (I-3) has a broad excitation band in a wavelength range of 350-600 nm. The broad excitation band has a FWHM greater than 50 nm, preferably greater than 70 nm and more preferably greater than 90 nm.

According to a specific embodiment of the present invention, the phosphor shown in Formula (I) is the phosphor shown in Formula (I-4) as follows:

$$T_xE_ySi_zN_rTb_a \qquad (I\text{-}4),$$

wherein, T, E, x, y, z, r and a are defined as above.

In the phosphor shown in Formula (I-4), T is preferably Ca, Sr or Ba. In the phosphor shown in Formula (I-4), E is preferably Ca, Ba or Bi. The phosphor shown in Formula (I-4) is preferably constituted by Sr, Si, N, Tb and Ca, Ba or Bi. The example of the phosphor shown in Formula (I-4) includes, but not limited to, $Sr_{2.3}Si_{4.9}Tb_{0.08}Bi_{0.02}N_{8.17}$, $Sr_{2.2}Ca_{0.3}Si_{5.2}Tb_{0.1}N_{8.7}$, $Sr_{2.3}Ca_{0.05}Si_{4.8}Tb_{0.25}N_{8.22}$, $Sr_{1.7}Ba_{0.5}Si_5Tb_{0.15}N_{8.28}$, $Sr_{1.9}Ba_{0.1}Si_{5.1}Tb_{0.15}N_{8.28}$ and $Sr_{1.5}Ba_{0.05}Si_{5.5}Tb_{0.3}N_{8.67}$. According to a specific embodiment of the present invention, the phosphor shown in Formula (I-4) is excited by an excitation light which can be absorbed by Tb ion and has an emission band with a FWHM greater than 50 nm, preferably greater than 55 nm and more preferably greater than or equal to 60 nm or 80 nm. In some aspects of these embodiments, the phosphor shown in Formula (I-4) is excited by an excitation light having a wavelength of 250-600 nm and has an emission band with a FWHM greater than 50 nm, preferably greater than 55 nm and more preferably greater than or equal to 60 nm or 80 nm. In some aspects of these embodiments, the phosphor shown in Formula (I-4) is excited by an excitation light having a wavelength of 350-600 nm and has an emission band with a FWHM greater than 50 nm, preferably greater than 55 nm and more preferably greater than or equal to 60 nm or 80 nm. According to a specific embodiment of the present invention, the phosphor shown in Formula (I-4) is excited by an excitation light which can be absorbed by Tb ion and has an emission band from a yellow light area to a red light area in a luminescent spectrum. According to a specific embodiment of the present invention, the phosphor shown in Formula (I-4) is excited by an excitation light which can be absorbed by Tb ion and it has an emission band with a FWHM greater than 50 nm in the luminescent spectrum from a yellow light area to a red light area, preferably greater than 55 nm and more preferably greater than or equal to 60 nm or 80 nm. According to a specific embodiment of the present invention, the phosphor shown in Formula (I-4) has a broad excitation band in a wavelength range of 350-600 nm. The broad excitation band has a FWHM greater than 50 nm, preferably greater than 70 nm and more preferably greater than 90 nm.

The phosphor of the present invention can be used as a red phosphor. The phosphor of the present invention is excited by an excitation light which can be absorbed by Tb ion and has an emission band from a yellow light area to a red light area in a luminescent spectrum. According to the present invention, the luminescent color of the phosphor red. According to a specific embodiment of the present invention, the phosphor shown ire Formula (I) is excited by an excitation light having a wavelength of 250-600 nm and has an emission band from a yellow light area to a red light area in a luminescent spectrum. According to a specific embodiment of the present invention, the phosphor shown in Formula (I) is excited by an excitation light having a wavelength of 350-600 nm and has an emission band from a yellow light area to a red light area in a luminescent spectrum.

At present, many red phosphors use $Eu^{3+}$ as the activator, and its radioactive map is a sharp peak form. The luminous efficiency is difficult to increase and the light color lacks adjustability.

The phosphor of the present invention is excited by an excitation light which can be absorbed by Tb ion and has an emission band with a FWHM greater than 50 nm, preferably greater than 55 nm and more preferably greater than or equal to 60 nm or 80 nm in a luminescent spectrum. Therefore, the phosphor of the present invention can overcome the disadvantages of the poor efficiency and the absence of the adjustability for the light color in the conventional phosphors. According to the present invention, the phosphor is excited by an excitation light having a wavelength of 250-600 nm and it has an emission band with a FWHM greater than 50 nm in the luminescent spectrum, preferably greater than 55 nm and more preferably greater than or equal to 60 nm or 80 nm. According to the present invention, the phosphor is excited by an excitation light having a wavelength of 350-600 nm and it has an emission band with a FWHM greater than 50 nm in the luminescent spectrum, preferably greater than 55 nm and more preferably greater than or equal to 60 nm or 80 nm.

According to a specific embodiment of the present invention, the phosphors shown in Formula (I-1) to Formula (I-4) are excited by an excitation light having a wavelength of 250-600 nm and they have an emission band with a FWHM greater than 50 nm in the luminescent spectrum, preferably greater than 55 nm and more preferably greater than or equal to 60 nm or 80 nm. According to a specific embodiment of the present invention, the phosphors shown in Formula (I-1) to Formula (I-4) are excited by an excitation light having a wavelength of 350-600 nm and they have an emission band with a FWHM greater than 50 nm in the luminescent spectrum, preferably greater than 55 nm and more preferably greater than or equal to 60 nm or 80 nm.

According to a specific embodiment of the present invention, the phosphors shown as Formulas $Sr_{1.4}Si_{5.6}Tb_{0.3}N_{8.7}$, $Sr_2Si_5Tb_{0.15}N_{8.15}$, $Sr_{2.6}Si_{4.3}Tb_{0.01}N_{7.48}$, $Sr_{1.88}Si_5Tb_{0.08}N_8$, $Sr_{1.94}Si_5Tb_{0.03}Li_{0.03}N_8$, $Sr_{1.9}Si_5Tb_{0.03}Li_{0.03}N_{7.97}$, $Ca_{1.92}Si_5Tb_{0.04}Li_{0.04}N_8$, $Ba_{1.92}Si_5Tb_{0.04}Li_{0.04}N_8$, $Sr_{1.9}Si_{5.1}Tb_{0.1}K_{0.15}N_{8.22}$, $Sr_2Si_{5.2}Tb_{0.03}Na_{0.3}N_{8.4}$, $Sr_{2.5}Si_{4.8}Tb_{0.2}Mn_{0.2}N_{8.17}$, $Sr_{2.4}Si_{4.7}Tb_{0.3}Dy_{0.3}N_{8.47}$, $Sr_2Si_5Tb_{0.03}Eu_{0.03}N_{8.05}$, $Sr_{2.3}Si_{4.9}Tb_{0.08}Bi_{0.02}N_{8.17}$, $Sr_{2.2}Ca_{0.3}Si_{5.2}Tb_{0.1}N_{8.7}$, $Sr_{2.3}Ca_{0.05}Si_{4.8}Tb_{0.25}N_{8.22}$, $Sr_{1.7}Ba_{0.5}Si_5Tb_{0.15}N_{8.28}$, $Sr_{1.9}Ba_{0.1}Si_{5.1}Tb_{0.15}N_{8.28}$ and $Sr_{1.5}Ba_{0.05}Si_{5.5}Tb_{0.3}N_{8.67}$ are excited by an excitation light having a wavelength of 250-600 nm, preferably having a wavelength of 350-600 nm and they have an emission band with a FWHM greater than 50 nm in the luminescent spectrum, preferably greater than 55 nm and more preferably greater than or equal to 60 nm or 80 nm.

The phosphor of the present invention may optionally include an additional co-activator and/or a sensitizer. The conventional co-activator and sensitizer in the art can be used, which will not be described anymore herein.

The phosphor of the present invention can be manufactured by any conventional phosphor manufacturing technology, for example, but not limited to, a solid state method, a sol-gel method, a co-precipitation method, a combustion synthesis method, a hydrothermal method, a chemical vapor phase method, a physical evaporation method and so on. The solid state method uses a dry mixing or a wet mixing manner to mix the raw materials and then calcinates/sinters the raw materials at a high temperature to obtain the phosphor. When the phosphor is manufactured by the solid state method, if necessary, a flux agent may be added.

The element raw material used to manufacture the phosphor of the present invention includes a metal or a compound containing the element. The example of the compound includes, but not limited to: oxide, nitride, sulfide, carbide, halogen compound, carbonate, nitrate, oxalate, sulfate, organic salt and so on. The element raw material used can serve as an activator, a sensitizer and/or a charge compensator for the phosphor. According to a specific embodiment of the present invention, when Sr ion and Tb ion are used to synthesize the phosphor, since the valence number of Sr ion is 2 and the valence number of Tb ion is 3 or 4, the charge compensation can be performed by adding non-divalent ions, such as alkali metal ions (Li, Na, K, Rb and Cs) to increase the luminous efficiency of the phosphor.

According to a specific embodiment of the present invention, the solid state method can be used to manufacture the phosphor of the present invention. In some aspects, the raw material needed to manufacture the phosphor of the present invention is mixed uniformly and then a heating reaction is performed. The heating temperature is 1,000° C. to 1,800° C., preferably 1,100° C. to 1,700° C. and more preferably 1,200° C. to 1,600° C. The heating time is 0.5 hours to 72 hours, preferably 1 hour to 60 hours and more preferably 1.5 hours to 48 hours. The heating pressure is 0.3 atmosphere (atm) to 15 atm, preferable 0.5 atm to 10 atm and more preferably 0.7 atm to 5 atm. The heating reaction is performed in an atmosphere which may have a reducing capacity so as to change a bonding environment around the Tb ion, thereby changing a light emitting property of the Tb ion. The reducing atmosphere includes a carbon-containing compound and a gas selected from the group consisting of hydrogen, ammonia and a combination thereof. In some embodiments, the carbon-containing compound includes C1-C3 alkane, carbon monoxide, carbon dioxide, carbon-containing polymer or a combination thereof. In some embodiments, the carbon-containing polymer heated at high temperature in a range of 1,000° C. to 1,800° C. in the reducing atmosphere may generate carbon monoxide, carbon dioxide, C1-C3 alkane or a combination thereof. In some embodiments, the carbon-containing compound is carbon monoxide, and the gas is the hydrogen, and a molar ratio of the carbon monoxide to the hydrogen is in a range of 1:3 to 1:1. In some embodiments, the carbon-containing compound is methane, and the gas is the hydrogen, and a molar ratio of the methane to the hydrogen is in a range of 1:3 to 3:1. In some embodiments, the carbon-containing compound is methane, and the gas is the ammonia. In some embodiments, the gas selected from the group consisting of hydrogen, ammonia and a combination thereof may be replaced with hydrogen-containing ceramics or hydrogen-containing alloys. In some embodiments, the atmosphere further includes inert gas, such as nitrogen, argon or a combination thereof.

When the phosphor is manufactured, if necessary, the flux agent may be used. By adding the flux agent, the sintering reaction of the phosphor can be facilitated and the reaction temperature needed can be reduced. The example of the flux agent includes, but not limited to AlF$_3$, B$_2$O$_3$, H$_3$BO$_3$, BaO, BaCl$_2$, BaF$_2$, Bi$_2$O$_3$, CaHPO$_4$, CaF$_2$, CaSO$_4$, LiF, Li$_2$O, Li$_2$CO$_3$, LiNO$_3$, K$_2$O, KF, KCl, MgF$_2$, MoO$_3$, NaCl, Na$_2$O, NaF, Na$_3$AlF$_6$, NH$_4$F, NH$_4$Cl, (NH$_4$)$_2$HPO$_4$, SrF$_2$, SrS, CaS, SrSO$_4$, SrHPO$_4$, PbO, PbF$_2$, WO$_3$, carbamide, glucose, other low melting-point substances and a combination thereof.

If necessary, the phosphor manufactured by the solid state method can be further grinded. The example of manufacturing the phosphor of the present invention by the solid state method is as described in the following embodiments, but not limited to these.

The phosphor of the present invention can be used for a light emitting apparatus, for example, but not limited to, a photoluminescence apparatus, an electroluminescence apparatus, a cathode ray luminescence apparatus, and so on. The phosphor of the present invention is excited by an excitation light and has a broad emission band. Therefore, it can overcome the disadvantages of the poor efficiency and the absence of adjustability for the light color in the conventional phosphors, and meets the industrial needs greatly. According to a specific embodiment of the present invention, the phosphor of the present invention can be used for a photoluminescence apparatus. According to another specific embodiment of the present invention, the phosphor of the present invention can be used for a LED, for example, but not limited to, a LED which is excited by a blue light or a UV light. According to a specific embodiment of the present invention, the phosphor of the present invention can be used for a WLED. In addition the phosphor of the present invention may be used independently or used together with other phosphors, for example, but not limited to, a yellow phosphor, a blue phosphor, a green phosphor and/or other red phosphors and so on.

The present invention also provides a light emitting apparatus which has the phosphor as shown in the above-mentioned Formula (I). The light emitting apparatus may be, for example, but not limited to, a photoluminescence apparatus, an electroluminescence apparatus, a cathode ray luminescence apparatus and so on. According to a specific embodiment of the present invention, the light emitting apparatus is a photoluminescence apparatus. According to the present invention, the phosphor in the light emitting apparatus is excited by an excitation light and has a broad emission band. Therefore, it can overcome the disadvantages of the poor efficiency and the absence of adjustability for the light color in the conventional phosphors, and meets the industrial needs greatly. Generally, the light emitting apparatus may include, for example, a light source (e.g., a LED chip (such as a blue LED chip)) and a phosphor, wherein the phosphor is excited by an excitation light from the light source. According to a specific embodiment of the present invention, the light emitting apparatus of the present invention is a LED, for example, but not limited to, a LED which is excited by a blue light or a UV light. In some aspects of these embodiments, the light emitting apparatus includes a blue light source and a phosphor. According to a specific embodiment of the present invention, the light emitting apparatus of the present invention is a WLED. In addition, in the light emitting apparatus, the phosphor of the present invention may be used independently or used together with other phosphors, for example, but not limited to, a yellow phosphor, a blue phosphor, a green phosphor and/or other red phosphors and so on.

The light emitting apparatus of the present invention can be used for a general illumination, an illumination for display (such as a traffic sign), a medical apparatus illumination, an automobile electronic apparatus and so on. The light emitting apparatus of the present invention is also suitable for a backlight source of a liquid crystal display (LCD) and thus can be used for a displayer (such as a mobile phone, a digital camera, a television and a computer screen).

The present invention will be described more specifically through the embodiments. However, these embodiments are not used to limit the scope of the present invention. Unless otherwise specified, in the following embodiments and the comparative embodiments, "%" and "part by weight" used to represent the content of any component and the quantity of any substance are based on weight.

The present disclosure will be explained in further detail with reference to the embodiments below. However, the present disclosure is not limited to these embodiments.

Embodiment 1: Manufacturing and Analyzing $Sr_{2.3}Si_5Tb_{0.08}N_{8.28}$ Phosphor The solid state method was used to manufacture $Sr_{2.3}Si_5Tb_{0.08}N_{8.28}$ phosphor. According to the cationic proportion of the chemical formula, $Sr_3N_2$, $Si_3N_4$, and $Tb_4O_7$ powders were weighed and then mixed uniformly in a glove box. Next, the mixed powders were put in a graphite crucible and calcined under a reducing atmosphere containing mixed nitrogen, carbon monoxide and hydrogen gas at a calcination temperature of 1,500° C. for six hours to obtain $Sr_{2.3}Si_5Tb_{0.08}N_{8.28}$ phosphor. A molar ratio of nitrogen: carbon monoxide:hydrogen is 18:1:1. The crystal structure of the phosphor was confirmed as $Sr_2Si_5N_8$ structure through the X-ray diffraction (XRD) analysis. Through the analysis via a fluorescence spectrophotometer, under a wavelength of 420 nm which can be absorbed by Tb ions, the phosphor was excited to generate a broad emission band with a peak value at approximately 604 nm having a FWHM of 80 nm, and the luminescent spectrum thereof is as shown in FIG. 1. The oxidation state of Tb ions were analyzed via the X-ray photoelectron spectroscopy (XPS) measurement and the spectrum was shown in FIG. 2. The peak at 1282 eV due to Tb ions were observed. The above results confirmed that the valence of terbium ions is lower than 3+, which will be explained in Comparative Embodiment 1 below.

Comparative Embodiment 1: Manufacturing and Analyzing $Sr_{2.3}Si_5Tb_{0.08}N_{8.28}$ Phosphor The solid state method was used to manufacture $Sr_{2.3}Si_5Tb_{0.08}N_{8.28}$ phosphor. According to the cationic proportion of the chemical formula, $Sr_3N_2$, $Si_3N_4$, and $Tb_4O_7$ powders were weighed and then mixed uniformly in a glove box. Next, the mixed powders were put in a molybdenum crucible and calcined under a reducing atmosphere containing mixed nitrogen and hydrogen gas at a calcination temperature of 1,500° C. for six hours to obtain $Sr_{2.3}Si_5Tb_{0.08}N_{8.28}$ phosphor. A molar ratio of nitrogen to hydrogen is 9:1. The crystal structure of the phosphor was confirmed as $Sr_2Si_5N_6$ structure through the X-ray diffraction (XRD) analysis. Through the analysis via a fluorescence spectrophotometer, under a wavelength of 276 nm which can be absorbed by terbium ions, the phosphor was excited to generate several narrow peaks at 542 nm with FWHM of approximately 10 nm, 587 nm with FWHM of approximately 18 nm, and 623 nm with FWHM of approximately 15 nm due to $Tb^{3+}$ ions. The maximum FWHM was approximately 18 nm, and the luminescent spectrum thereof is as shown in FIG. 3. The oxidation state of Tb ions were analyzed via the X-ray photoelectron spectroscopy (XPS) measurement and the spectrum was shown in FIG. 2. The peak at 1285 eV was observed, indicating the existence of $Tb^{3+}$ ion. The above results confirmed that the valence of terbium ions is 3+. It was found that the peak positions (binding energy) for the sample of Embodiment 1 were smaller than the peak positions (binding energy) for the sample of Comparative Embodiment 1. It is well known that the binding energy of photoelectrons for metal ions decreased when the oxidation state was decreased.

Figure 2:
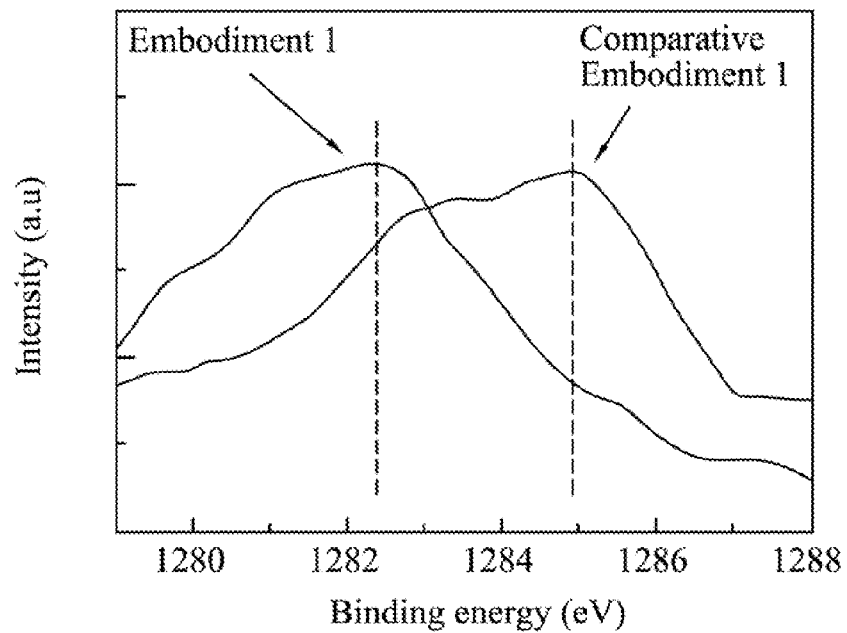
FIG. 2 is a X-ray photoelectron spectrum of Embodiment 1 and Comparative Embodiment 1 of the present invention.
Figure 3:
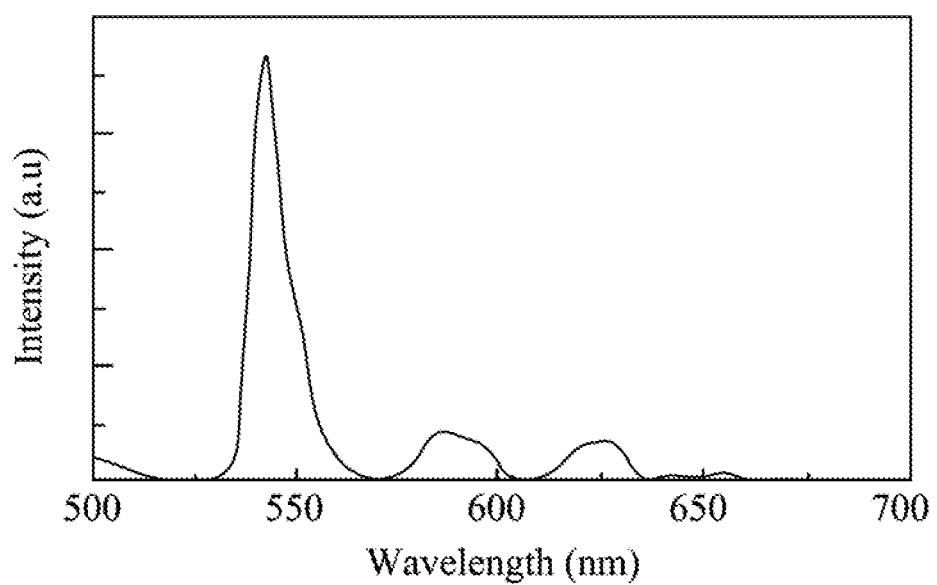
FIG. 3 is a luminescent spectrum of $Sr_{2.3}Si_5Tb_{0.08}N_{8.28}$ phosphor according to Comparative Embodiment 1 of the present invention.

Therefore, the result in FIG. 2 indicated that the oxidation state (valence) of terbium ions in Embodiment 1 was lower 3+. The change of oxidation state for terbium ions in Embodiment 1 is considered to be the reason for the appearance of broad emission band as shown in FIG. 1.

Comparative Embodiment 2: Manufacturing and Analyzing $Sr_{2.3}Si_5Tb_{0.08}N_{8.28}$ Phosphor The solid state method was used to manufacture $Sr_{2.3}Si_5Tb_{0.08}N_{8.28}$ phosphor. According to the cationic proportion of the chemical formula, $Sr_3N_2$, $Si_3N_4$, and $Tb_4O_7$ powders were weighed and then mixed uniformly in a glove box. Next, the mixed powders were put in an aluminum oxide crucible and calcined under a reducing atmosphere containing mixed nitrogen and hydrogen gas at a calcination temperature of 1,500° C. for six hours to obtain $Sr_{2.3}Si_5Tb_{0.08}N_{8.28}$ phosphor. A molar ratio of nitrogen to hydrogen is 9:1. The crystal structure of the phosphor was confirmed as $Sr_2Si_5N_8$ structure through the X-ray diffraction (XRD) analysis. Through the analysis via a fluorescence spectrophotometer, under a wavelength of 276 nm which can be absorbed by terbium ions, the phosphor was excited to generate several narrow peaks at 542 nm with FWHM of approximately 10 nm, 587 nm with FWHM of approximately 18 nm, and 623 nm with FWHM of approximately 15 nm due to $Tb^{3+}$ ions. The maximum FWHM was approximately 18 nm. The oxidation state of Tb ions were analyzed via the X-ray photoelectron spectroscopy (XPS) measurement. The peak at 1285 eV was observed, indicating the existence of $Tb^{3+}$ ion. The above results confirmed that the valence of terbium ions is 3+.

Comparative Embodiment 3: Manufacturing and Analyzing $Sr_{2.3}Si_5Tb_{0.08}N_{8.28}$ Phosphor The solid state method was used to manufacture $Sr_{2.3}Si_5Tb_{0.08}N_{8.28}$ phosphor. According to the cationic proportion of the chemical formula, $Sr_3N_2$, $Si_3N_4$, and $Tb_4O_7$ powders were weighed and then mixed uniformly in a glove box. Next, the mixed powders were put in a BN crucible and calcined under a reducing atmosphere containing mixed nitrogen and hydrogen gas at a calcination temperature of 1,500° C. for six hours to obtain $Sr_{2.3}Si_5Tb_{0.08}N_{8.28}$ phosphor. A molar ratio of nitrogen to hydrogen is 9:1. The crystal structure of the phosphor was confirmed as $Sr_2Si_5N_8$ structure through the X-ray diffraction (XRD) analysis. Through the analysis via a fluorescence spectrophotometer, under a wavelength of 276 nm which can be absorbed by terbium ions, the phosphor was excited to generate several narrow peaks at 542 nm with FWHM of approximately 10 nm, 587 nm with FWHM of approximately 18 nm, and 623 nm with FWHM of approximately 15 nm due to $Tb^{3+}$ ions. The maximum FWHM was approximately 18 nm. The oxidation state of Tb ions were analyzed via the X-ray photoelectron spectroscopy (XPS) measurement. The peak at 1285 eV was observed, indicating the existence of $Tb^{3+}$ ion. The above results confirmed that the valence of terbium ions is 3+.

Embodiment 2: Manufacturing and Analyzing $Sr_{1.82}Si_5Tb_{0.03}Bi_{0.09}N_8$ Phosphor The solid state method was used to manufacture $Sr_{1.82}Si_5Tb_{0.03}Bi_{0.09}N_8$ phosphor. According to the cationic proportion of the chemical formula, $Sr_3N_2$, $Si_3N_4$, $Bi_2O_3$ and $Tb_4O_7$ powders were weighed and then mixed uniformly in a glove box. Next, the mixed powders were put in a graphite crucible and calcined under a reducing atmosphere containing mixed nitrogen, carbon monoxide and hydrogen gas at a calcination temperature of 1,400° C. for four hours to obtain $Sr_{1.82}Si_5Tb_{0.03}Bi_{0.09}N_8$ phosphor. A molar ratio of nitrogen:carbon monoxide:hydrogen is 15:1:3. The crystal structure of the phosphor was confirmed as $Sr_2Si_5N_8$ structure through the X-ray diffraction (XRD) analysis. Through the analysis via a fluorescence spectrophotometer, under a wavelength of 420 nm which can be absorbed by Tb ion, the phosphor was excited to generate a broad emission band with a peak value at approximately 604 nm having a FWHM of 80 nm. The oxidation state of Tb ions were analyzed via the X-ray photoelectron spectroscopy (XPS) measurement. The peak at 1282 eV due to Tb ions were observed, indicating the oxidation state of terbium ions were lower than 3+. The above results confirmed that the valence of terbium ions is lower than 3+.

Embodiment 3: Manufacturing and Analyzing $Sr_{2.3}Si_5Tb_{0.09}Tm_{0.01}N_{8.3}$ Phosphor The solid state method was used to manufacture $Sr_{2.3}Si_5Tb_{0.09}Tm_{0.01}N_{8.3}$ phosphor. According to the cationic proportion of the chemical formula, $Sr_3N_2$, $Si_3N_4$, $Tm_2O$ and $Tb_4O_7$ powders were weighed and then mixed uniformly in a glove box. Next, the mixed powders were put in a graphite crucible and calcined under a reducing atmosphere containing mixed nitrogen, methane and ammonia gas at a calcination temperature of 1,450° C. for four hours to obtain $Sr_{2.3}Si_5Tb_{0.09}Tm_{0.01}N_{8.3}$ phosphor. A molar ratio of nitrogen:methane:ammonia is 19:1:20. The crystal structure of the phosphor was confirmed as $Sr_2Si_5N_8$ structure through the X-ray diffraction (XRD) analysis. Through the analysis via a fluorescence spectrophotometer, under a wavelength of 420 nm which can be absorbed by Tb ion, the phosphor was excited to generate a broad emission band with a peak value at approximately 605 nm having a FWHM of 80 nm. The oxidation state of Tb ions were analyzed via the X-ray photoelectron spectroscopy (XPS) measurement. The peak at 1282 eV due to Tb ions were observed, indicating the oxidation state of terbium ions were lower than 3+. The above results confirmed that the valence of terbium ions is lower than 3+.

Comparative Embodiment 4: Manufacturing and Analyzing $Sr_{2.3}Si_5Tb_{0.09}Tm_{0.01}N_{8.3}$ Phosphor The solid state method was used to manufacture $Sr_{2.3}Si_5Tb_{0.09}Tm_{0.01}N_{8.3}$ phosphor. According to the cationic proportion of the chemical formula, $Sr_3N_2$, $Si_3N_4$, $Tm_2O_3$ and $Tb_4O_7$ powders were weighed and then mixed uniformly in a glove box. Next, the mixed powders were put in a BN crucible and calcined under ammonia gas at a calcination temperature of 1,450° C. for four hours to obtain $Sr_{23}Si_5Tb_{0.09}Tm_{0.01}N_{8.3}$ phosphor. The crystal structure of the phosphor was confirmed as $Sr_2Si_5N_8$ structure through the X-ray diffraction (XRD) analysis. Through the analysis via a fluorescence spectrophotometer, under a wavelength of 276 nm which can be absorbed by terbium ions, the phosphor was excited to generate several narrow peaks at 542 nm with FWHM of approximately 10 nm, 587 nm with FWHM of approximately 18 nm, and 623 nm with FWHM of approximately 15 nm due to $Tb^{3+}$ ions. The maximum FWHM was approximately 18 nm. The oxidation state of Tb ions were analyzed via the X-ray photoelectron spectroscopy (XPS) measurement. The peak at 1285 eV was observed, indicating the existence of $Tb^{3+}$ ion. The above results confirmed that the valence of terbium ions is 3+.

Embodiment 4: Manufacturing and Analyzing $Sr_{2.3}Si_5Tb_{0.07}Sm_{0.03}N_{8.3}$ Phosphor The solid state method was used to manufacture $Sr_{2.3}Si_5Tb_{0.07}Sm_{0.03}N_{8.3}$ phosphor. According to the cationic proportion of the chemical formula, $Sr_3N_2$, $Si_3N_4$, $Sm_2O_3$ and $Tb_4O_7$ powders were weighed and then mixed uniformly in a glove box. Next, the mixed powders were put in a graphite crucible and calcined under a reducing atmosphere containing mixed nitrogen, methane and hydrogen gas at a calcination temperature of 1,600° C. for four hours to obtain $Sr_{2.3}Si_5Tb_{0.07}Sm_{0.03}N_{8.3}$ phosphor. A molar ratio of nitrogen:methane:hydrogen is 16:3:1. The crystal structure of the phosphor was confirmed as $Sr_2Si_5N_8$ structure through the X-ray diffraction (XRD) analysis. Through the analysis via a fluorescence spectrophotometer, under a wavelength of 420 nm which can be absorbed by Tb ion, the phosphor was excited to generate a broad emission band with a peak value at approximately 603 nm having a FWHM of 81 nm. The oxidation state of Tb ions were analyzed via the X-ray photoelectron spectroscopy (XPS) measurement. The peak at 1282 eV due to Tb ions were observed, indicating the oxidation state of terbium ions were lower than 3+. The above results confirmed that the valence of terbium ions is lower than 3+.

Embodiment 5: Manufacturing and Analyzing $Sr_{1.8}Si_5Tb_{0.1}Li_{0.1}N_8$ Phosphor The solid state method was used to manufacture $Sr_{1.8}Si_5Tb_{0.1}Li_{0.1}N_8$ phosphor. According to the cationic proportion of the chemical formula, $Sr_3N_2$, $Si_3N_4$, LiF and $Tb_4O_7$ powders were weighed and then mixed uniformly in a glove box. Next, the mixed powders were put in a graphite crucible and calcined under a reducing atmosphere containing mixed nitrogen, methane and hydrogen gas at a calcination temperature of 1,550° C. for six hours to obtain $Sr_{1.8}Si_5Tb_{0.1}Li_{0.1}N_8$ phosphor. A molar ratio of nitrogen:methane:hydrogen is 16:1:3. The crystal structure of the phosphor was confirmed as $Sr_2Si_5N_8$ structure through the X-ray diffraction (XRD) analysis. Through the analysis via a fluorescence spectrophotometer, under a wavelength of 420 nm which can be absorbed by Tb ion, the phosphor was excited to generate a broad emission band with a peak value at approximately 603 nm having a FWHM of 81 nm. The oxidation state of Tb ions were analyzed via the X-ray photoelectron spectroscopy (XPS) measurement. The peak at 1282 eV due to Tb ions were observed indicating the oxidation state of terbium ions is lower than 3+. The above results confirmed that the valence of terbium ions is lower than 3+.

According to the experiments results above, the reducing atmosphere comprising both hydrogen-containing compounds and carbon-containing pounds would lead to the valence of the Tb ion lower than 3+ and an emission band of the phosphor with ha FWHM greater than 50 nm. In contrast, the reducing atmosphere comprising only hydrogen-containing compounds fails to lead to the valence of the Tb ion lower than 3+ and an emission band of the phosphor with a FWHM greater than 50 nm.

The phosphor of the present invention is excited by an excitation light and has a broad emission band. As such, the drawbacks in the conventional phosphors like the poor luminous efficiency and lacking of adjustability for the light color have been overcome. On the other hand, the phosphor according to the present invention exhibits excellent performance, such as good heat stability, good chemical stability, nontoxicity and high strength, urgently required in the industry. The above-mentioned embodiments are only used to describe the composition and the manufacturing method of the present invention exemplarily rather than limiting the present invention. Those of skills in the art can modify and change the above-mentioned embodiments, without departing from the spirit and scope of the present invention. Therefore, the right protection scope of the present invention shall be defined by the following claims.

What is claimed is:

1. A phosphor having Formula (I):

wherein,
T is Mg, Ca, Sr or Ba;
E is Mg, Ca, Ba, Ti, Cu, Zn, B, Al, In, Sn, Sb, Bi, Ga, Y, La or Lu;
L is Li, Na or K;
M is Pm, Tm, Yb or Mn; and
$1.4 \leq x \leq 2.6$, $0 \leq y \leq 0.5$, $4.3 \leq z \leq 5.6$, $7.4 \leq r \leq 9$, $0.01 \leq a \leq 0.5$, $0 \leq b \leq 0.5$, $0 \leq c \leq 0.5$,
wherein Tb ion is used as a luminescence center, and valence of the Tb ion is lower than 3+, and the phosphor is excited by an excitation light and has an emission band with a full width at half maximum greater than 50 nm.

2. The phosphor of claim 1, wherein the phosphor is formed under an atmosphere comprising a carbon-containing compound and a gas selected from the group consisting of hydrogen, ammonia and a combination thereof.

3. The phosphor of claim 2, wherein the carbon-containing compound comprises C1-C3 alkane, carbon monoxide, carbon dioxide or a combination thereof.

4. The phosphor of claim 1, having Formula $T_xSi_zN_rTb_aM_c$.

5. The phosphor of claim 1, wherein the full width at half maximum is greater than or equal to 80 nm.

6. The phosphor of claim 1, wherein the excitation light has a wavelength in a range of 350-600 nm.

7. A light emitting apparatus comprising the phosphor of claim 1.

8. The light emitting apparatus of claim 7, which is a LED.

9. A method of forming a phosphor, the method comprising:
mixing a Tb-containing compound, a Si-containing compound and a IIA metal-containing compound to form a mixture, and each of the Tb-containing compound, the Si-containing compound and the IIA metal-containing compound is nitride or oxide, and at least one of the Tb-containing compound, the Si-containing compound and the IIA metal-containing compound is nitride, wherein mixing the Tb-containing compound, the Si-containing compound and the IIA metal-containing compound further comprises mixing $Tm_2O_3$ with the Tb-containing compound, the Si-containing compound and the IIA metal-containing compound to form the mixture; and
calcining the mixture in an atmosphere to form the phosphor consisting of Tb ion, Si ion, IIA-metal ion, N ion and Tm ion, wherein the atmosphere comprises a carbon-containing compound and a gas selected from the group consisting of hydrogen, ammonia and a combination thereof, and the Tb ion of the phosphor has a valence lower than 3+.

10. The method of claim 9, wherein the carbon-containing compound comprises C1-C3 alkane, carbon monoxide, carbon dioxide or a combination thereof.

11. The method of claim 9, wherein the carbon-containing compound is carbon monoxide, and the gas is the hydrogen, and a molar ratio of the carbon monoxide to the hydrogen is in a range of 1:3 to 1:1.

12. The method of claim 9, wherein the carbon-containing compound is methane, and the gas is the hydrogen, and a molar ratio of the methane to the hydrogen is in a range of 1:3 to 3:1.

13. The method of claim 9, wherein calcining the mixture in the atmosphere is under a temperature of 1,400° C. to 1,600° C.

* * * * *